(12) United States Patent
Hung et al.

(10) Patent No.: US 10,854,780 B2
(45) Date of Patent: Dec. 1, 2020

(54) LIGHT EMITTING APPARATUS AND MANUFACTURING METHOD THEREOF

(71) Applicant: Genesis Photonics Inc., Tainan (TW)

(72) Inventors: Cheng-Wei Hung, Changhua County (TW); Chin-Hua Hung, Tainan (TW); Xun-Xain Zhan, Tainan (TW); Chuan-Yu Liu, Tainan (TW); Yun-Chu Chen, Tainan (TW); Yu-Feng Lin, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 16/180,027

(22) Filed: Nov. 5, 2018

(65) Prior Publication Data
US 2019/0157503 A1   May 23, 2019

Related U.S. Application Data

(60) Provisional application No. 62/581,763, filed on Nov. 5, 2017.

(51) Int. Cl.
| | |
|---|---|
| *H01L 33/10* | (2010.01) |
| *H01L 33/36* | (2010.01) |
| *H01L 33/26* | (2010.01) |
| *H01L 33/00* | (2010.01) |
| *H01L 33/50* | (2010.01) |

(Continued)

(52) U.S. Cl.
CPC ............ *H01L 33/10* (2013.01); *H01L 33/005* (2013.01); *H01L 33/26* (2013.01); *H01L 33/36* (2013.01); *H01L 33/508* (2013.01); *H01L 33/38* (2013.01); *H01L 33/46* (2013.01); *H01L 2933/0041* (2013.01)

(58) Field of Classification Search
CPC .............................................. H01L 2933/0041
See application file for complete search history.

(56) References Cited

U.S. PATENT DOCUMENTS

| | | | |
|---|---|---|---|
| 6,155,699 | A | 12/2000 | Miller et al. |
| 7,045,828 | B2 | 5/2006 | Shimizu et al. |
| 8,350,283 | B2 | 1/2013 | Nishiuchi et al. |

(Continued)

FOREIGN PATENT DOCUMENTS

| | | |
|---|---|---|
| CN | 1674316 | 9/2005 |
| CN | 101515621 | 8/2009 |

(Continued)

OTHER PUBLICATIONS

"Final Office Action of related U.S. Appl. No. 15/657,299," dated Oct. 2, 2018, pp. 1-20.

(Continued)

*Primary Examiner* — Thao P Le
(74) *Attorney, Agent, or Firm* — JCIPRNET

(57) ABSTRACT

A light emitting device including a light emitting unit and a phosphor resin layer is provided. The light emitting unit has a top surface and a bottom surface opposite to each other. Each of the light emitting units includes two electrodes. The two electrodes are disposed on the bottom surface. The phosphor resin layer is disposed on the top surface of the light emitting unit. One side of the phosphor resin layer has a mark. One of the two electrodes is closer to the mark with respect to the other one of the two electrodes.

8 Claims, 17 Drawing Sheets

(51) Int. Cl.
   *H01L 33/46*   (2010.01)
   *H01L 33/38*   (2010.01)

(56) References Cited

U.S. PATENT DOCUMENTS

| | | | |
|---|---|---|---|
| 8,482,016 | B2 | 7/2013 | Harada |
| 8,860,061 | B2 | 10/2014 | Kotani |
| 9,029,893 | B2 | 5/2015 | Akimoto et al. |
| 9,419,189 | B1 | 8/2016 | David et al. |
| 9,490,398 | B2 | 11/2016 | Oyamada et al. |
| 9,887,329 | B2 | 2/2018 | Yamada |
| 9,922,963 | B2 | 3/2018 | Hung et al. |
| 2003/0006509 | A1 | 1/2003 | Suzuki et al. |
| 2003/0067070 | A1 | 4/2003 | Kwon et al. |
| 2004/0119402 | A1 | 6/2004 | Shiang et al. |
| 2004/0239242 | A1 | 12/2004 | Mano et al. |
| 2005/0045897 | A1 | 3/2005 | Chou et al. |
| 2006/0055309 | A1 | 3/2006 | Ono et al. |
| 2006/0169994 | A1 | 8/2006 | Tu et al. |
| 2007/0114552 | A1 | 5/2007 | Jang et al. |
| 2008/0150119 | A1 | 6/2008 | Jang et al. |
| 2009/0242917 | A1 | 10/2009 | Inoue et al. |
| 2009/0296389 | A1 | 12/2009 | Hsu |
| 2010/0066236 | A1 | 3/2010 | Xu et al. |
| 2010/0117530 | A1 | 5/2010 | Lin et al. |
| 2010/0258419 | A1 | 10/2010 | Chung et al. |
| 2010/0258830 | A1 | 10/2010 | Ide et al. |
| 2011/0001157 | A1 | 1/2011 | McKenzie et al. |
| 2011/0018017 | A1 | 1/2011 | Bierhuizen et al. |
| 2011/0079805 | A1 | 4/2011 | Yu et al. |
| 2011/0102883 | A1 | 5/2011 | Narendran et al. |
| 2011/0297980 | A1 | 12/2011 | Sugizaki et al. |
| 2012/0025218 | A1 | 2/2012 | Ito et al. |
| 2012/0032578 | A1* | 2/2012 | Annen ............... B82Y 30/00 313/483 |
| 2012/0223351 | A1 | 9/2012 | Margalit |
| 2012/0235126 | A1 | 9/2012 | Yamazaki et al. |
| 2012/0236582 | A1 | 9/2012 | Waragaya et al. |
| 2012/0261700 | A1 | 10/2012 | Ooyabu et al. |
| 2012/0305942 | A1 | 12/2012 | Lo et al. |
| 2013/0093313 | A1 | 4/2013 | Oyamada |
| 2013/0105978 | A1 | 5/2013 | Hung |
| 2013/0121000 | A1 | 5/2013 | Lee et al. |
| 2013/0194794 | A1 | 8/2013 | Kim |
| 2013/0207141 | A1 | 8/2013 | Reiherzer |
| 2013/0207142 | A1 | 8/2013 | Reiherzer |
| 2013/0256711 | A1 | 10/2013 | Joo et al. |
| 2013/0277093 | A1 | 10/2013 | Sun et al. |
| 2013/0285091 | A1 | 10/2013 | Akimoto et al. |
| 2014/0009060 | A1 | 1/2014 | Kimura et al. |
| 2014/0021493 | A1 | 1/2014 | Andrews et al. |
| 2014/0054621 | A1 | 2/2014 | Seko |
| 2014/0124812 | A1 | 5/2014 | Kuramoto et al. |
| 2014/0131753 | A1 | 5/2014 | Ishida et al. |
| 2014/0138725 | A1 | 5/2014 | Oyamada |
| 2014/0252389 | A1 | 9/2014 | Koizumi et al. |
| 2015/0014720 | A1 | 1/2015 | Tien |
| 2015/0102373 | A1 | 4/2015 | Lee et al. |
| 2015/0102377 | A1* | 4/2015 | Huang .................. H01L 33/58 257/98 |
| 2015/0115300 | A1 | 4/2015 | Tomizawa et al. |
| 2015/0179901 | A1 | 6/2015 | Ok et al. |
| 2015/0188004 | A1* | 7/2015 | Ozeki .................. H01L 33/507 257/98 |
| 2015/0263242 | A1 | 9/2015 | Tomizawa et al. |
| 2015/0311405 | A1 | 10/2015 | Oyamada et al. |
| 2016/0035952 | A1 | 2/2016 | Yamada et al. |
| 2016/0079496 | A1 | 3/2016 | Huang et al. |
| 2016/0155900 | A1 | 6/2016 | Bono et al. |
| 2016/0155915 | A1 | 6/2016 | Ling et al. |
| 2016/0181476 | A1 | 6/2016 | Chang et al. |
| 2016/0190406 | A1 | 6/2016 | Liu et al. |
| 2018/0294388 | A1 | 10/2018 | Hung et al. |

FOREIGN PATENT DOCUMENTS

| | | |
|---|---|---|
| CN | 101855735 | 10/2010 |
| CN | 101867003 | 10/2010 |
| CN | 101878540 | 11/2010 |
| CN | 101978516 | 2/2011 |
| CN | 102132428 | 7/2011 |
| CN | 201910421 | 7/2011 |
| CN | 102222757 | 10/2011 |
| CN | 102263194 | 11/2011 |
| CN | 102290500 | 12/2011 |
| CN | 102315354 | 1/2012 |
| CN | 102347423 | 2/2012 |
| CN | 102637809 | 8/2012 |
| CN | 102738368 | 10/2012 |
| CN | 103022010 | 4/2013 |
| CN | 103050601 | 4/2013 |
| CN | 103137571 | 6/2013 |
| CN | 103187515 | 7/2013 |
| CN | 103199183 | 7/2013 |
| CN | 103531725 | 1/2014 |
| CN | 103534822 | 1/2014 |
| CN | 203774363 | 8/2014 |
| CN | 203910851 | 10/2014 |
| CN | 104253194 | 12/2014 |
| CN | 104347610 | 2/2015 |
| CN | 104521015 | 4/2015 |
| JP | 2012227470 | 11/2012 |
| TW | 201114072 | 4/2011 |
| TW | M453969 | 5/2013 |
| TW | 201401565 | 1/2014 |
| TW | 201403873 | 1/2014 |
| TW | 201541674 | 11/2015 |
| WO | 2011093454 | 8/2011 |

OTHER PUBLICATIONS

"Office Action of related U.S. Appl. No. 15/787,811," dated Oct. 18, 2018, pp. 1-49.
"Office Action of related U.S. Appl. No. 15/881,802," dated Aug. 10, 2018, pp. 1-23.
"Office Action of Taiwan related Application, serial No. 104131-083 ," dated Oct. 5, 2018, pp. 1-8.
"Office Action of CN Related Application, application No. 201510244596.4," dated Apr. 27, 2018, p. 1-p. 11.
"Office Action of Related U.S. Appl. No. 15/657,299 ," dated May 16, 2018, p. 1-p. 37.
"Office Action of CN Related Application, application No. 201410362787.6," dated Apr. 20, 2018, p. 1-p. 9.
"Office Action of Related U.S. Appl. No. 15/959,534 ," dated Jun. 21, 2018, p. 1-p. 30.
"Office Action of Taiwan Related Application No. 107117295", dated Jun. 11, 2019, pp. 1-5.
"Office Action of Taiwan Related Application No. 105108594", dated Jun. 18, 2019, pp. 1-4.
"Notice of Allowance of Related U.S. Appl. No. 15/823,480", dated Apr. 12, 2019, pp. 1-26.
"Office Action of Related U.S. Appl. No. 15/924,461", dated Feb. 15, 2019, pp. 1-47.
"Office Action of China Related Application No. 201610293182.5", dated Jan. 22, 2019, pp. 1-6.
"Office Action of Related U.S. Appl. No. 15/823,480", dated Dec. 31, 2018, pp. 1-35.
"Office Action of Taiwan Related Application No. 107119063", dated Dec. 6, 2018, pp. 1-3.
"Office Action of Related U.S. Appl. No. 15/973,552", dated Nov. 29, 2018, pp. 1-22.
"Office Action of China Related Application No. 201610157140.9", dated Nov. 1, 2018, pp. 1-6.
"Office Action of China Related Application No. 201610156914.6", dated Nov. 2, 2018, pp. 1-9.
"Office Action of Related U.S. Appl. No. 15/908,779", dated Oct. 30, 2018, pp. 1-28.
"Office Action of China Related Application, application No. 201610830051.6", dated Sep. 27, 2019, p. 1-p. 6.

(56) References Cited

OTHER PUBLICATIONS

"Office Action of Taiwan Related Application, application No. 10821057660", dated Nov. 7, 2019, p. 1-p. 5.
"Office Action of Related U.S. Appl. No. 16/595,414", dated Dec. 11, 2019, p. 1-p. 9.
Cheng-Wei Hung et al., "Light-Emitting Device and Manufacturing Method Thereof", Unpublished U.S. Appl. No. 16/595,414, filed Oct. 27, 2019.
Yun-Han Wang et al., "Light Emitting Device and Manufacturing Method Thereof", Unpublished U.S. Appl. No. 16/543,648, filed Aug. 19, 2019.
"Office Action of Taiwan Related Application No. 108118972" B, dated Dec. 25, 2019, pp. 1-9.
"Office Action of Related U.S. Appl. No. 16/180,071", dated Jan. 8, 2020, pp. 1-28.
Office Action of Taiwan Related Application, application No. 105104666, dated Jun. 28, 2018, p. 1-p. 6.
Office Action of Related U.S. Appl. No. 16/004,445, dated Sep. 27, 2018, p. 1-p. 16.
Office Action of Related U.S. Appl. No. 16/004,445, dated Nov. 26, 2019, p. 1-p. 10.
"Office Action of China Related Application No. 201610830051.6", dated Mar. 21, 2019, pp. 1-9.
"Office Action of China Related Application No. 201610089097.7", dated Dec. 4, 2018, pp. 1-8.
"Office Action of China Related Application No. 201610157182.2", dated Dec. 3, 2018, pp. 1-11.
"Office Action of China Related Application, application No. 201910110303.1", dated Dec. 25, 2019, p. 1-p. 11.
"Office Action of Taiwan Related Application No. 105107287", dated Jan. 17, 2020, pp. 1-7.

\* cited by examiner

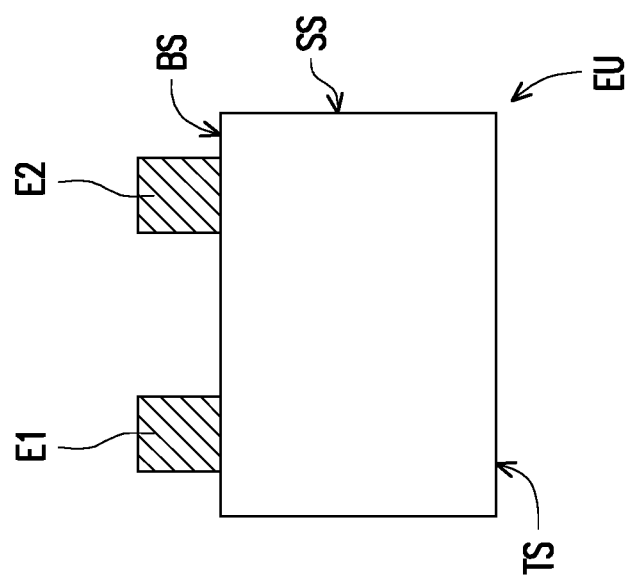
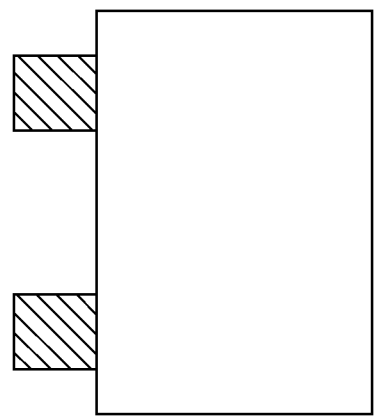
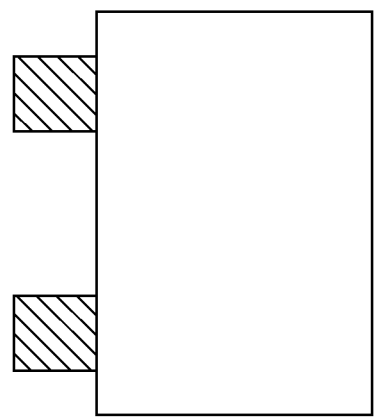
FIG. 3

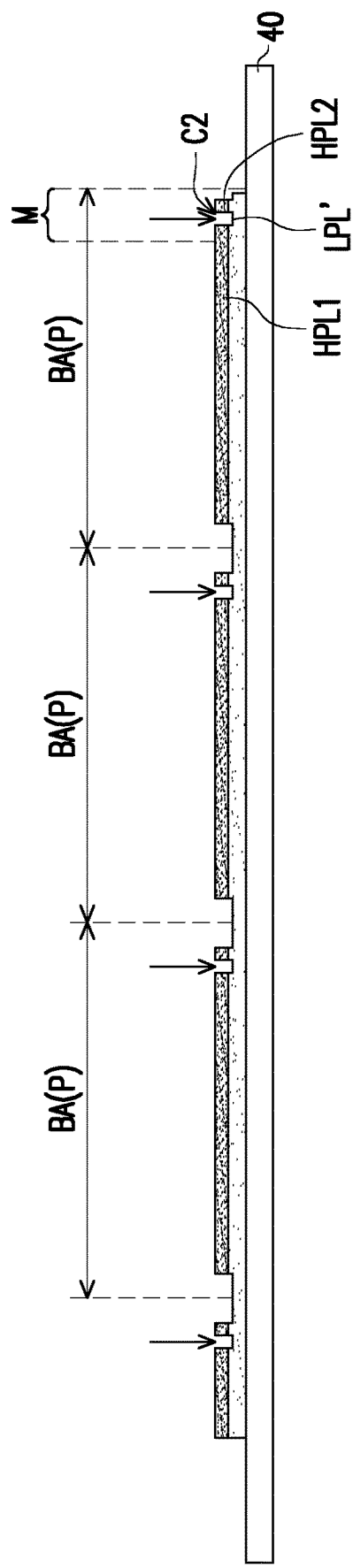
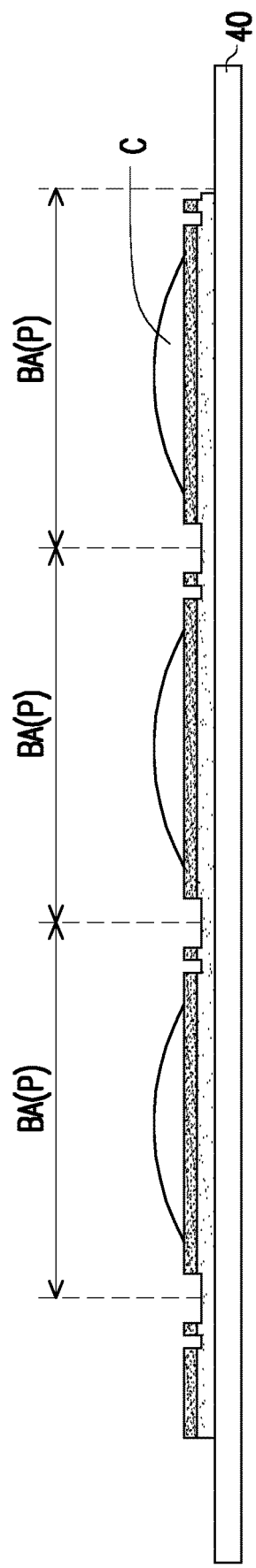

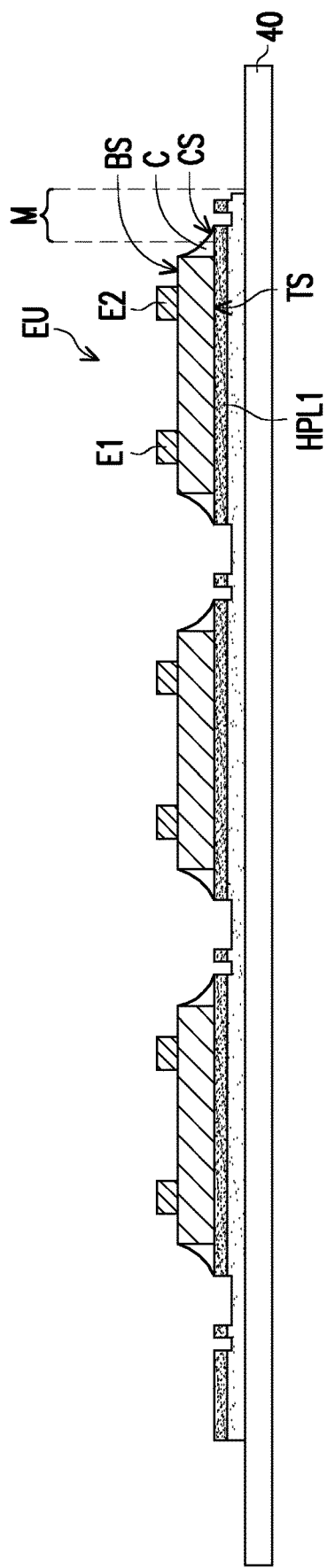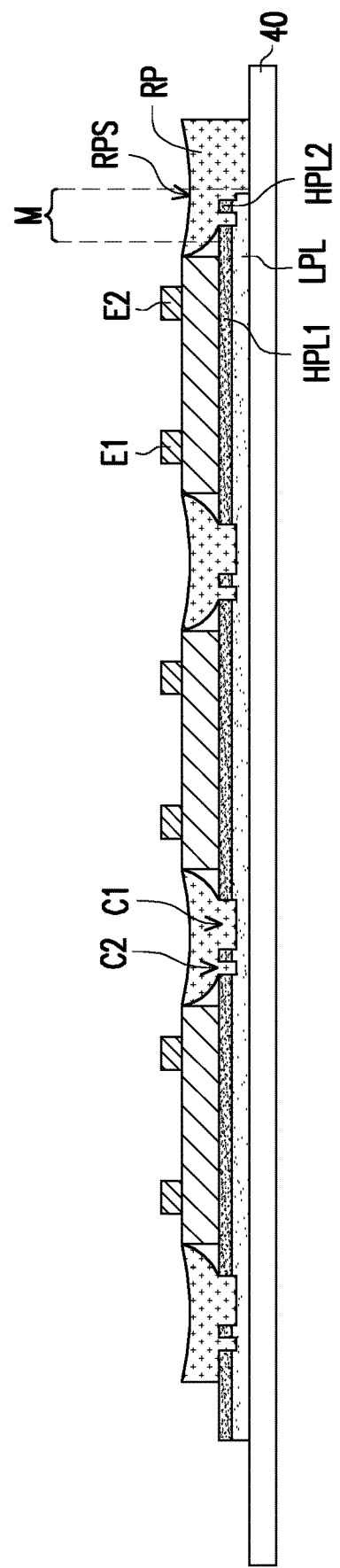
FIG. 8
FIG. 9

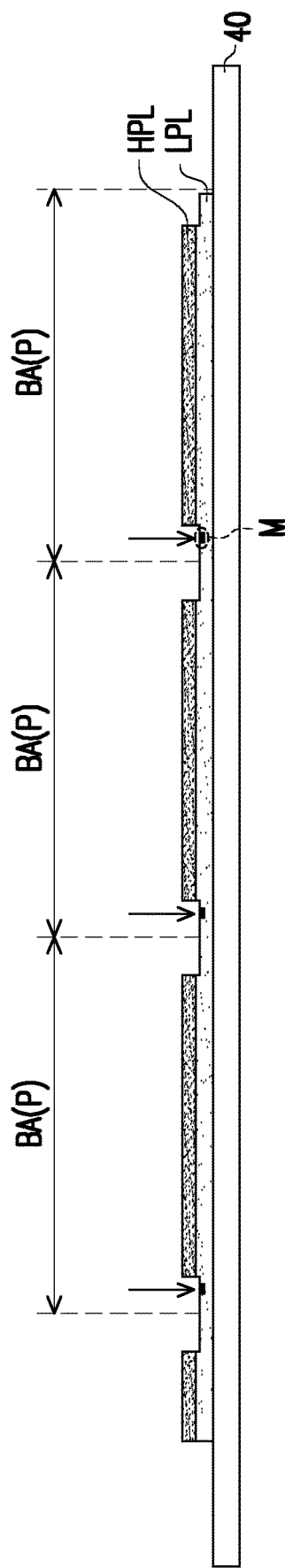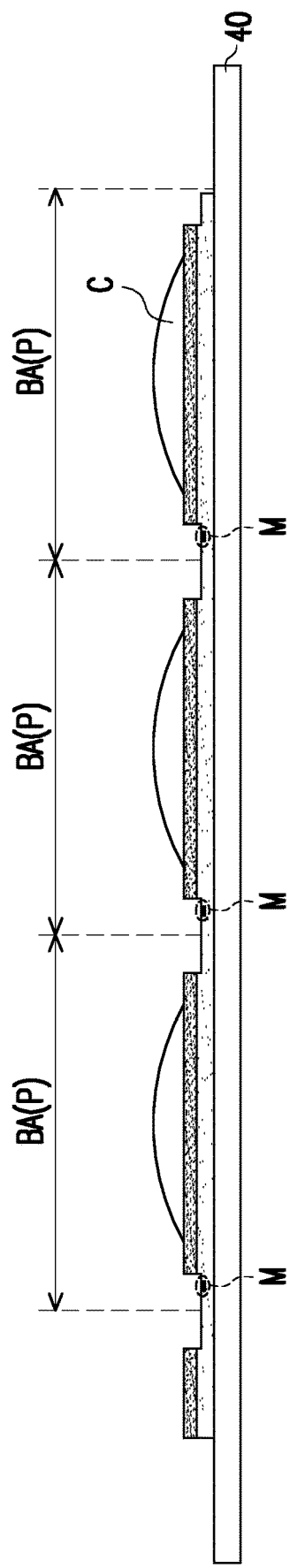

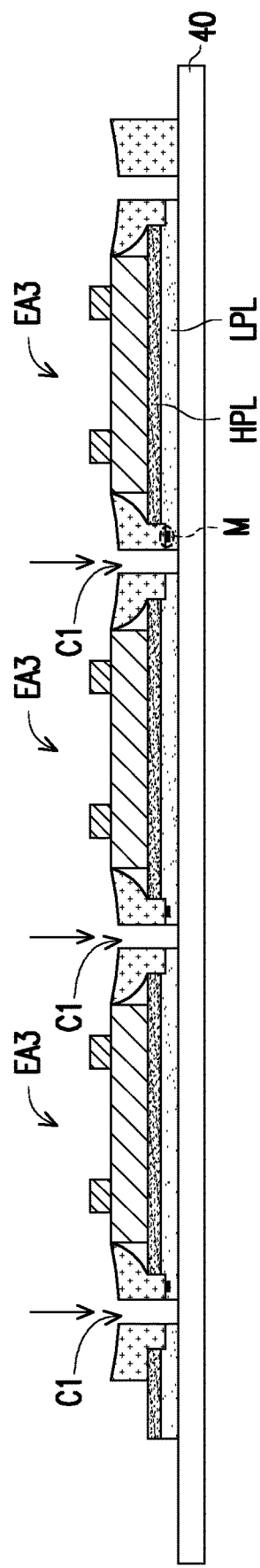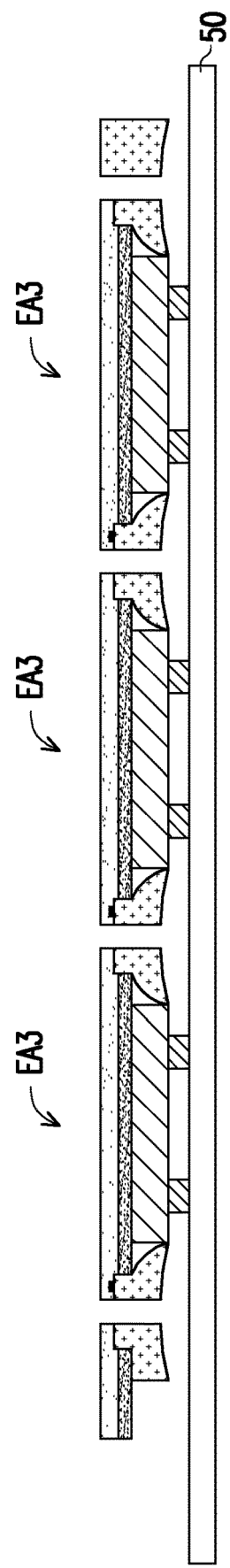

LIGHT EMITTING APPARATUS AND MANUFACTURING METHOD THEREOF

CROSS-REFERENCE TO RELATED APPLICATION

This application claims the priority benefit of U.S. provisional application Ser. No. 62/581,763, filed on Nov. 5, 2017. The entirety of the above-mentioned patent application is hereby incorporated by reference herein and made a part of this specification.

BACKGROUND

Technical Field

The invention relates to a light emitting device and a manufacturing method thereof, and particularly relates to a light emitting device using light emitting diodes as light sources and a manufacturing method thereof.

Description of Related Art

Since light emitting diode (LED) has advantages of high energy conversion rate, short response time and long service life, etc., it is widely applied in the lighting field. However, when a user connects the LED to an external electronic device, polarities of electrodes in the LED are often unclear and the electrodes are probably reversely connected to the external electronic device (or power supply), which may result in damage of the LED.

SUMMARY

The invention is directed to a light emitting device, and a user greatly reduces a chance of reversely connecting electrodes thereof.

The invention is directed to a manufacturing method of a light emitting device, which is adapted to manufacture the aforementioned light emitting device.

An embodiment of the invention provides a light emitting device including a light emitting unit and a phosphor resin layer. The light emitting unit has a top surface and a bottom surface opposite to each other. Each of the light emitting units includes two electrodes. The two electrodes are disposed on the bottom surface. The phosphor resin layer is disposed on the top surface of the light emitting unit. One side of the phosphor resin layer has a mark. One of the two electrodes is closer to the mark with respect to the other one of the two electrodes.

In an embodiment of the invention, the phosphor resin layer further includes a low-concentration phosphor resin layer and a high-concentration phosphor resin layer stacked with each other. The high-concentration phosphor resin layer is located between the light emitting unit and the low-concentration phosphor resin layer.

In an embodiment of the invention, the side of the phosphor resin layer is configured with a groove. The groove penetrates through the high-concentration phosphor resin layer and exposes a part of the low-concentration phosphor resin layer. The groove separates the high-concentration phosphor resin layer into a first portion and a second portion with different sizes. The mark at least includes a smaller one of the first portion and the second portion of the high-concentration phosphor resin layer.

In an embodiment of the invention, the side of the phosphor resin layer is configured with a chamfer, and the chamfer serves as the mark.

In an embodiment of the invention, the side of the phosphor resin layer is configured with a notch, and the notch serves as the mark.

In an embodiment of the invention, the light emitting device further includes a reflection protective member. The reflection protective member covers the light emitting unit and a part of the phosphor resin layer, and at least exposes the two electrodes and the low-concentration phosphor resin layer.

In an embodiment of the invention, the reflection protective member has a concave surface. The concave surface is recessed toward the phosphor resin layer.

In an embodiment of the invention, one side of the concave surface contacts the light emitting unit, and a second side of the concave surface faces the phosphor resin layer and extends toward a direction away from the light emitting unit.

In an embodiment of the invention, the light emitting device further includes a light transmissive resin layer. The light emitting unit further includes a side surface connected to the top surface and the bottom surface. The light transmissive resin layer is configured on the high-concentration phosphor resin layer and extends to the side surface of the light emitting unit.

An embodiment of the invention provides a manufacturing method of a light emitting device, which includes following steps: forming a phosphor resin layer; performing a first cutting procedure to the phosphor resin layer to form a plurality of first grooves in the phosphor resin layer, so as to separate the phosphor resin layer into a plurality of portions, where each of the portions serves as a bonding area; providing a plurality of light emitting units, where each of the light emitting units includes two electrodes; respectively forming a plurality of marks at one side of the portions of the phosphor resin layer; respectively bonding the light emitting units to the bonding areas. Each of the marks is close to one of the two electrodes of the corresponding light emitting unit and is away from the other one of the two electrodes; performing a final cutting procedure along the first grooves to form a plurality of light emitting devices.

In an embodiment of the invention, the step of forming the phosphor resin layer further includes following steps: forming a phosphor resin; statically disposing the phosphor resin to separate the phosphor resin into a high-concentration phosphor resin and a low-concentration phosphor resin stacked with each other; curing the phosphor resin into the phosphor resin layer, where the high-concentration phosphor resin and the low-concentration phosphor resin are respectively cured into the high-concentration phosphor resin layer and the low-concentration phosphor resin layer.

In an embodiment of the invention, the step of respectively forming the marks at the side, of the portions of the phosphor resin layer further includes: performing a second cutting procedure on the portions of the phosphor resin layer, so as to respectively form a plurality of second grooves in the portions of the phosphor resin layer, where in each portion of the phosphor resin layer, the second groove penetrates through the high-concentration phosphor resin layer and exposes a part of the low-concentration phosphor resin layer, and the second groove separates the high-concentration phosphor resin layer into a first portion and a second portion with different sizes. The mark at least includes a smaller one of the first portion and the second portion of the high-concentration phosphor resin layer.

In an embodiment of the invention, the step of respectively forming the marks at the side of the portions of the phosphor resin layer further includes: performing a second cutting procedure on the portions of the phosphor resin layer, so as to respectively form a plurality of second grooves in the portions of the phosphor resin layer. The second grooves cut out a plurality of chamfers in the portions of the phosphor resin layer. A cutting direction of the second cutting procedure is different to a cutting direction of the first cutting procedure. The chamfers serve as the marks.

In an embodiment of the invention, the step of respectively forming the marks at the side of the portions of the phosphor resin layer further includes: irradiating laser light to the portions of the phosphor resin layer, such that the low-concentration phosphor resin layer in each of the portions has a notch, and the notch serves as the mark.

In an embodiment of the invention, the step of respectively bonding the light emitting units to the bonding areas further includes: respectively forming a plurality of light transmissive resin layers on the high-concentration phosphor resin layers in the bonding areas; and respectively bonding the light emitting units to the high-concentration phosphor resin layers through the light transmissive resin layers.

In an embodiment of the invention, the method further includes: forming a reflection protective member on the phosphor resin layer and between the light emitting units to fill the first grooves, where the reflection protective member exposes the electrodes.

In an embodiment of the invention, the step of forming the reflection protective member further includes: statically disposing the reflection protective member, such that the reflection protective member forms a concave surface recessed toward the phosphor resin layer; and curing the reflection protective member.

Based on the above description, in the light emitting device and the manufacturing method thereof of the embodiments of the invention, since the distances between the mark on the phosphor resin layer and the two electrodes are different, the user may accordingly determine the polarities of the electrodes, so as to greatly reduce the chance of reversely connecting the electrodes.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 to FIG. 11 are schematic diagrams of a manufacturing flow of a light emitting device according to a first embodiment of the invention.

FIG. 21 to FIG. 26 are schematic diagrams of a manufacturing flow of a light emitting device according to a third embodiment of the invention.

DESCRIPTION OF THE EMBODIMENTS

Figure 12:
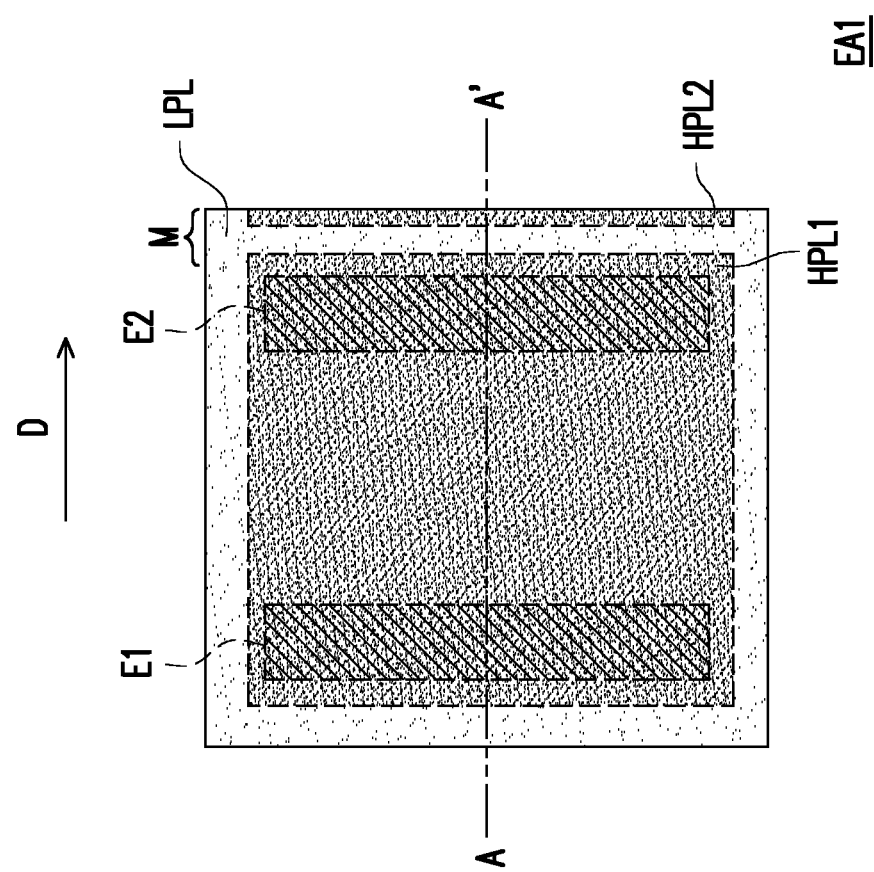
FIG. 12 is a top view of the light emitting device of the first embodiment.
Figure 13:
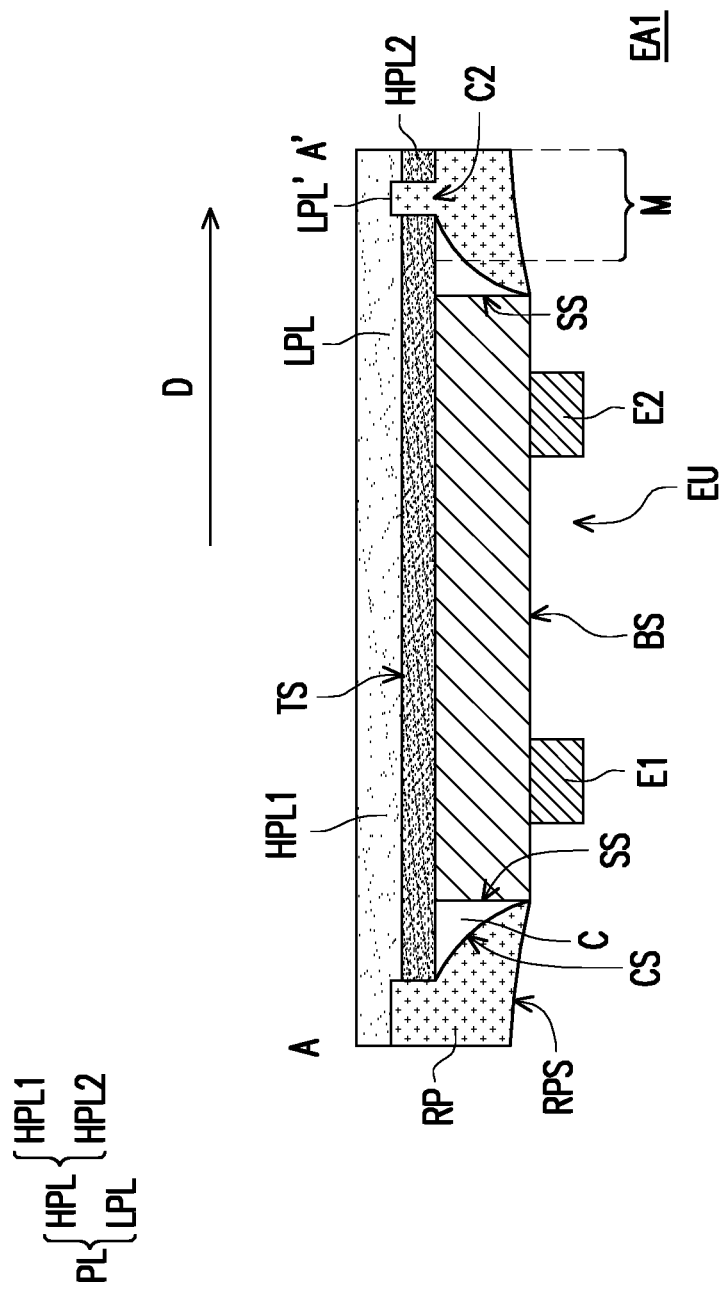
FIG. 13 is a cross-sectional view of FIG. 12 viewing along a section line A-A'.

FIG. 1 to FIG. 11 are schematic diagrams of a manufacturing flow of a light emitting device according to a first embodiment of the invention. FIG. 12 is a top view of the light emitting device of the first embodiment. FIG. 13 is a cross-sectional view of FIG. 12 viewing along a section line A-A'.

Figure 1:
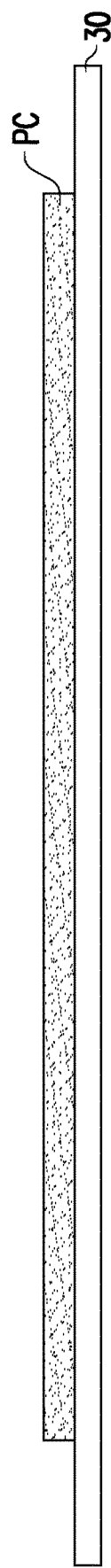

Referring to FIG. 1, a release film 30 is provided, and the release film 30 is, for example, a double-sided adhesive film. Then, a phosphor resin PC is formed on the release film 30. The phosphor resin PC may be formed by mixing phosphor powder and resin (for example, silicone).

Figure 2:
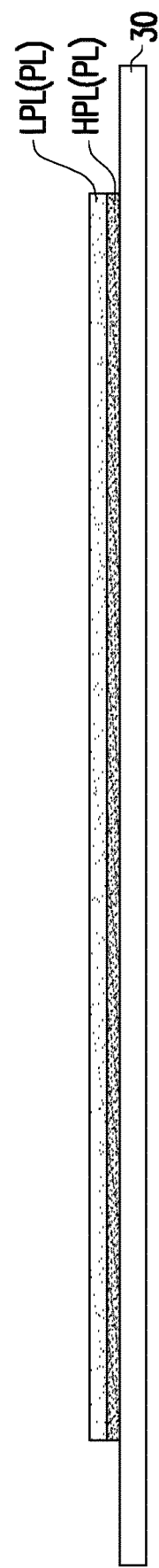

Referring to FIG. 2, after the phosphor resin PC is statically disposed for a period of time, for example, 24 hours, due to the gravity, most of phosphor powder in the phosphor resin PC may be deposited below, and there are still a few phosphor powder left on top, where the aforementioned static-disposing time is not limited to 24 hours. Namely, the phosphor resin PC may be separated into a high-concentration phosphor resin and a low-concentration phosphor resin stacked with each other after statically disposing. A concentration of the phosphor powder in the high-concentration phosphor resin is greater than a concentration of the phosphor powder in the low-concentration phosphor resin. Then, the phosphor resin PC is cured to form a phosphor resin layer PL. The high-concentration phosphor resin and the low-concentration phosphor resin are respectively hardened to form a high-concentration phosphor resin layer HPL and a low-concentration phosphor resin layer LPL. The curing method is, for example, heating and baking, though the invention is not limited thereto. In the embodiment, a thickness of the whole phosphor resin layer PL is, for example, 130 μm, though the invention is not limited thereto.

Referring to FIG. 3, a plurality of light emitting units EU is provided (for example, three light emitting units are provided, though the invention is not limited thereto), where each of the light emitting units EU has a top surface TS and a bottom surface BS opposite to each other and a side surface SS connected to the top surface TS and the bottom surface BS, and includes two electrodes E1 and E2 separated from each other. One of the two electrodes E1 and E2 (for example, the electrode E1) may be an N-type electrode, and the other one of the two electrodes E1 and E2 (for example, the electrode E2) may be a P-type electrode, though the invention is not limited thereto. The light emitting unit EU is, for example, a light emitting diode (LED) chip.

Figure 4:
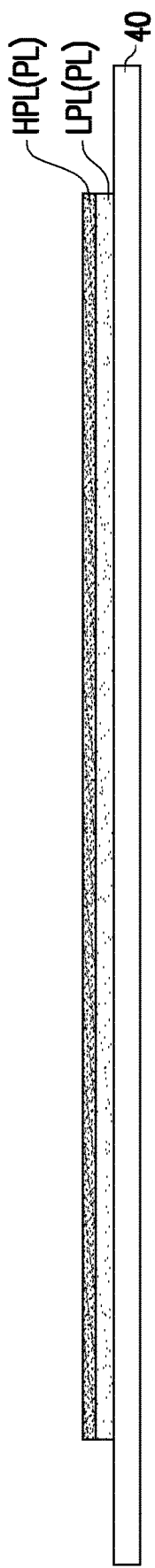

Referring to FIG. 4, another release film 40 is provided, and the release film 40 is, for example, also a double-sided adhesive layer. A surface of the low-concentration phosphor resin layer LPL exposed to external in FIG. 2 is bonded with the release film 40, and the original release film 30 is removed, such that the low-concentration phosphor resin layer LPL is located between the high-concentration phosphor resin layer HPL and the release film 40. In other words, such step is an operation of flipping the high-concentration phosphor resin layer HPL and the low-concentration phosphor resin layer LPL and moving the same to the release film 40 of another layer.

Figure 5:
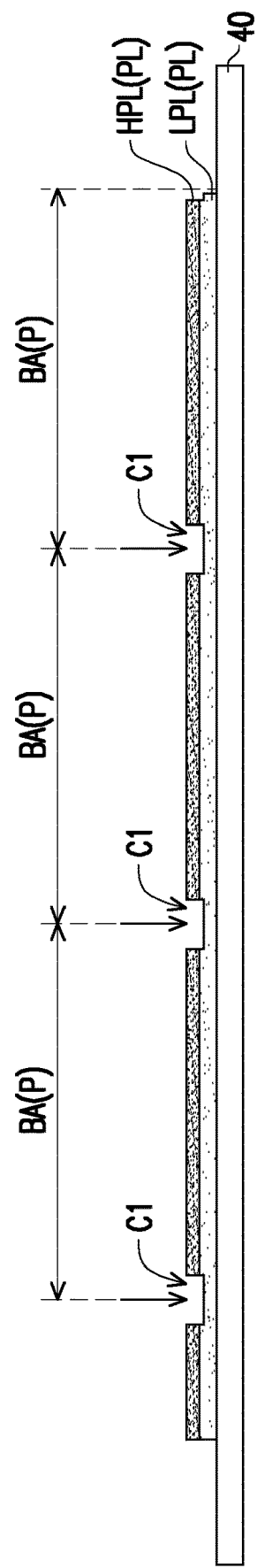

Referring to FIG. 5, a first cutting procedure is performed to the phosphor resin layer PL to form a plurality of first grooves C1 in the phosphor resin layer PL, so as to separate the phosphor resin layer PL into a plurality of portions P. Each portion P serves as a bonding area BA. In detail, in the embodiment, the first cutting procedure is, for example, to cut down by 80 μm by using a cutter with a blade width of 200 μm, so as to remove a part of the high-concentration phosphor resin layer HPL and the low-concentration phosphor resin layer LPL, and the remained high-concentration phosphor resin layer HPL is physically separated, and a width of the first groove C1 is about 200 μm. The so-called "physically separated" refers to that the high-concentration phosphor resin layers HPL are not directly connected. It should be noted that selection of the cutter and a cut down degree may be determined according to an actual recruitment, which are not limited by the invention.

Referring to FIG. 6, a plurality of marks M is respectively formed at one side of the portions P of the phosphor resin layer PL. In the embodiment, a method of forming the plurality of marks M is as follows: referring to FIG. 5, a second cutting procedure is further performed to the portions P of the phosphor resin layer PL to respectively form a plurality of grooves C2 in the portions P of the phosphor resin layer PL. In detail, in the embodiment, the second cutting procedure is, for example, to cut down by 80 μm by using a cutter with a blade width of 50 μm, so as to further remove a part of the high-concentration phosphor resin layer HPL, and a width of the second groove C2 is about 80 μm. Namely, the width of the second groove C2 is smaller than the width of the first groove C1. Moreover, in the embodiment, a cutting direction of the second cutting procedure is the same with a cutting direction of the first cutting procedure. It should be noted that selection of the cutter and a cut down degree may be determined according to an actual recruitment, which are not limited by the invention.

Moreover, referring to FIG. 6, in each portion P of the phosphor resin layer PL, the second groove C2 penetrates through the high-concentration phosphor resin layer HPL and exposes a part of the low-concentration phosphor resin layer LPL'. The second groove C2 separates the high-concentration phosphor resin layer HPL into a larger first portion HPL1 and a smaller second portion HPL2. The exposed part of the low-concentration phosphor resin layer LPL' is adjacent to the first portion HPL1 and the second portion HPL2. The exposed part of the low-concentration phosphor resin layer LPL' and the adjacent first portion HPL1 and the second portion HPL2 may serve as the mark M.

Referring to FIG. 7, a plurality of light transmissive resin layers C is respectively formed on the first portions HPL1 of the high-concentration phosphor resin layers HPL in the bonding areas BA. The light transmissive resin layers C is, for example, made of silicone, though the invention is not limited thereto.

Referring to FIG. 8, the light emitting units EU are respectively bonded to the first portions HPL1 of the high-concentration phosphor resin layers HPL through the light transmissive resin layers C. Moreover, each of the marks M is close to one of the two electrodes E1 and E2 (for example, the electrode E2) of the corresponding light emitting unit EU and is away from the other one of the two electrodes E1 and E2 (for example, the electrode E1). Due to a capillary phenomenon, the light transmissive resin layer C has an inclined surface CS with a curvature, and the closer to the top surface TS of the light emitting unit EU, the thicker the thickness of the light transmissive resin layer C is. A purpose of the light transmissive resin layer C is to fix the position of the light emitting unit EU.

Referring to FIG. 9, a reflection protective member RP is formed on the phosphor resin layer PL and between the light emitting units EU and fills the first grooves C1 and the second grooves C2. The reflection protective member RP exposes the electrodes E1 and E2. In detail, the reflection protective member RP is, for example, a white resin layer. First, the reflection protective member RP is applied to fill the first grooves C1 and the second grooves C2. Then, the reflection protective member RP is statically disposed for a period time, so that the reflection protective member RP forms a concave surface RPS recessed toward the phosphor resin layer PL. Finally, the reflection protective member RP is heated and cured to shape the reflection protective member RP.

Figure 10:
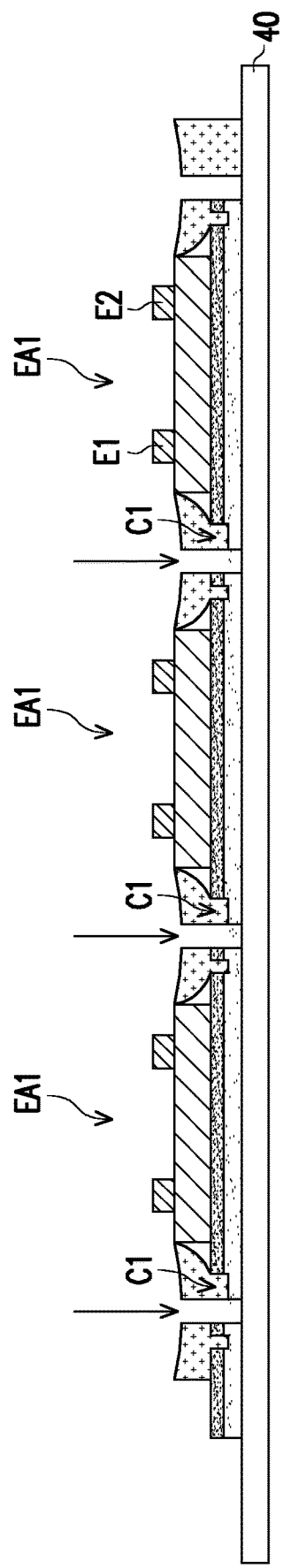

Referring to FIG. 10, a final cutting procedure is performed along the first grooves C1 to form a plurality of light emitting devices EA1. At this point, manufacturing of the light emitting device EA1 is substantially completed. In the embodiment, the light emitting device EA1 is, for example, a light emitting device including a single light emitting unit EU, and is a light emitting device EA1 of a chip scale package (CSP).

Figure 11:
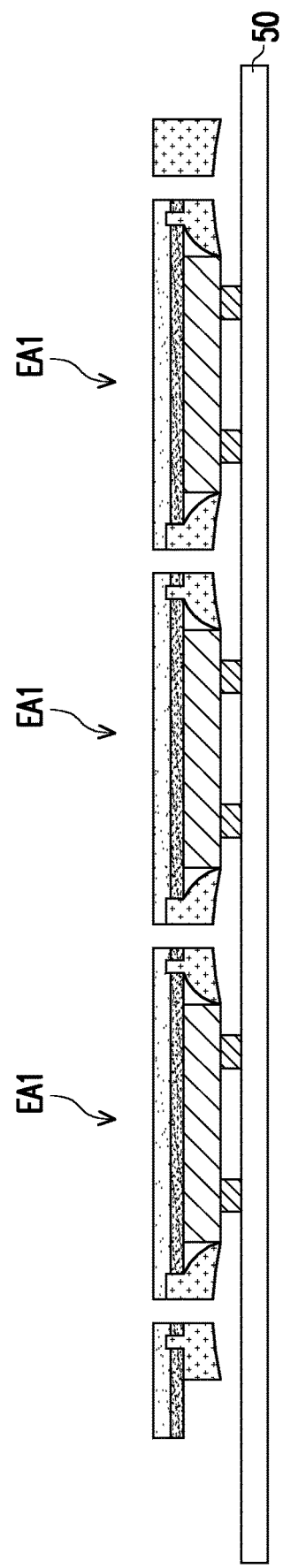

Referring to FIG. 11, a release film 50 is further provided, and the release film 50 is, for example, also a double-sided adhesive film or a blue film. The two electrodes E1 and E2 of FIG. 10 are bonded to the release film 50, and the original release film 40 is removed to flip the light emitting devices EA.

Referring to FIG. 12 and FIG. 13, in the embodiment, the light emitting device EA includes a light emitting unit EU, a phosphor resin layer PL, a light transmissive resin layer C and a reflection protective member RP. The light emitting unit EU has a top surface TS and a bottom surface BS opposite to each other and a side surface SS connected to the top surface TS and the bottom surface BS. Each of the light emitting units EU includes two electrodes E1 and E2. The two electrodes E1 and E2 are disposed on the bottom surface BS. A side of the phosphor resin layer PL is configured with a mark M. One of the two electrodes E1 and E2 (for example, the electrode E2) is closer to the mark M with respect to the other one of the two electrodes E1 and E2 (for example, the electrode E1). Namely, an average distance between the electrode E2 and the mark M is smaller than an average distance between the electrode E1 and the mark M.

In detail, in the embodiment, one side of the phosphor resin layer PL is configured with the second groove C2. The second groove C2 penetrates through the high-concentration phosphor resin layer HPL and exposes a part of the low-concentration phosphor resin layer LPL'. The second groove C2 separates the high-concentration phosphor resin layer HPL into a first portion HPL1 and a second portion HPL2 with different sizes. The mark M includes the exposed part of the low-concentration phosphor resin layer LPL', or at least one of the exposed part of the low-concentration phosphor resin layer LPL', the first portion HPL1 and the second portion HPL2. In detail, since the low-concentration phosphor resin layer LPL and the high-concentration phosphor resin layer HPL have different colors due to different concentrations thereof, viewing along a direction D, it is learned that the phosphor resin layer PL has a varied color distribution, for example, a deep color (corresponding to the first portion HPL1 of the high-concentration phosphor resin layer HPL), a light color (corresponding to the exposed low-concentration phosphor resin layer LPL) and a deep color (corresponding to the second portion HPL2 of the high-concentration phosphor resin layer HPL) to cause a gradation of color, and such gradation of color may be regarded as a type of the mark M, i.e. the mark M includes the first portion HPL1, the exposed part of the low-concentration phosphor resin layer LPL' and the second portion HPL2.

Based on another point of view, since colors of the first portion HPL1 and the second portion IIPL2 of the high-concentration phosphor resin layer IIPL located adjacent to both sides of the exposed low-concentration phosphor resin layer LPL' are all lower than the color of the low-concentration phosphor resin layer LPL', the exposed low-concentration phosphor resin layer LPL' may also be regarded as one type of the mark M, i.e. the mark M includes the exposed low-concentration phosphor resin layer LPL'. Alternatively, since the low-concentration phosphor resin layer LPL' is configured between the smaller second portion HPL2 of the high-concentration phosphor resin layer HPL located at one side of the phosphor resin layer PL and the first portion HPL1 of the high-concentration phosphor resin layer HPL, a combination of one of the first portion HPL1 and the second portion HPL2 of the high-concentration phosphor resin layer HPL and the low-concentration phosphor resin layer LPL' may also be regarded as one type of the mark M, i.e. the mark M includes the first portion HPL1 of the high-concentration phosphor resin layer HPL and the low-concentration phosphor resin layer LPL', or the mark M includes the second portion HPL2 of the high-concentration phosphor resin layer HPL and the low-concentration phosphor resin layer LPL', which is not limited by the invention.

In the embodiment, the reflection protective member RP covers the light emitting unit EU and a part of the phosphor resin layer PL, and at least exposes the two electrodes E1 and E2 and the low-concentration phosphor resin layer LPL. The reflection protective member RP has a concave surface RPS facing external. The concave surface RPS is recessed toward the phosphor resin layer PL. A first side of the concave surface RPS contacts the light emitting unit EU, and a second side of the concave surface faces the phosphor resin layer PL and extends a long a direction away from the light emitting unit EU. When the light emitting device EA1 of the embodiment is to be connected to an external substrate (for example, a back plate, a printed circuit board or other types of substrate in a display panel) later, through the design that the surface of the reflection protective member RP exposed to external is the concave surface RPS, a gap spaced between the light emitting device EA and the external substrate due to protrusion of the reflection protective member RP between the reflection protective member RP and the external substrate is avoided, and generation of such gap may result in a fact that the electrodes E1 and E2 of the light emitting unit EU cannot be perfectly bounded to the external substrate.

In the embodiment, the light transmissive resin layer C is disposed on the high-concentration phosphor resin layer HPL and extends to the side surface SS of the light emitting unit EU.

Based on the above description, in the light emitting device and the manufacturing method thereof of the embodiment of the invention, since the phosphor resin layer PL is configured with the mark M, and average distances respectively between the mark M and the two electrodes E1 and E2 are different, when manufacturing of the light emitting devices EA is completed, the user may be informed that the electrode E2 closer to the mark M is, for example, a P-type electrode, and the user may clearly know that the electrode E2 is the P-type electrode, and the electrode E1 is an N-type electrode with an opposite electrical property. In brief, the user simply determines polarities of the electrodes according to the distances between the mark M and the electrodes E1 and E2, which may greatly reduce the chance of reversely connecting the electrodes.

FIG. 14 to FIG. 19 are schematic diagrams of a manufacturing flow of a light emitting device according to a second embodiment of the invention. FIG. 20 is a top view of the light emitting device of the second embodiment.

Some steps of the manufacturing flow of the light emitting device EA2 of the second embodiment are similar to that of the manufacturing flow of the light emitting device EA of the first embodiment, and only differences there between are described below.

Figure 14:
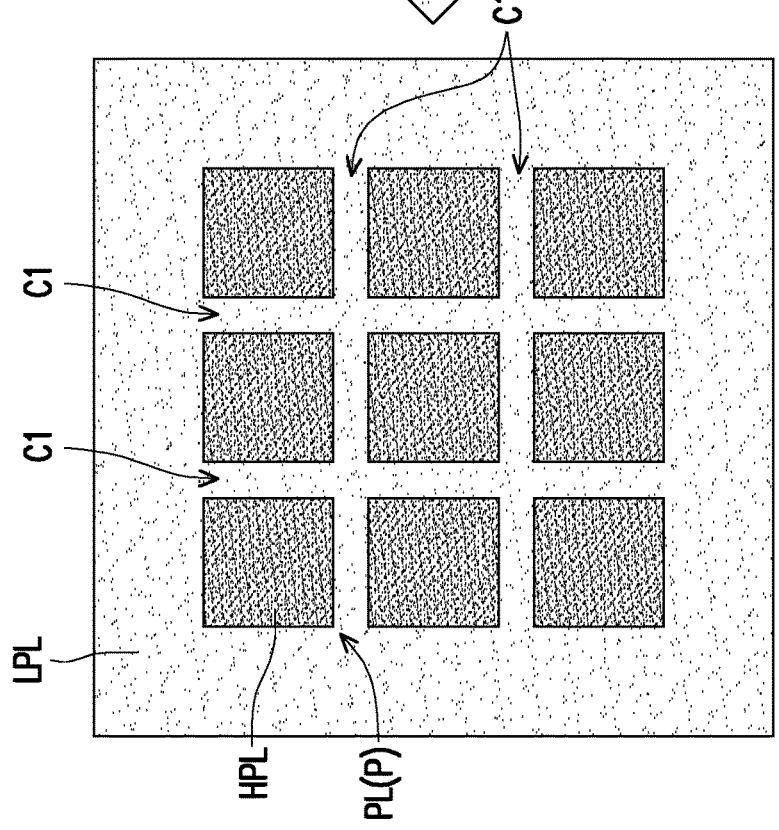
Figure 17:
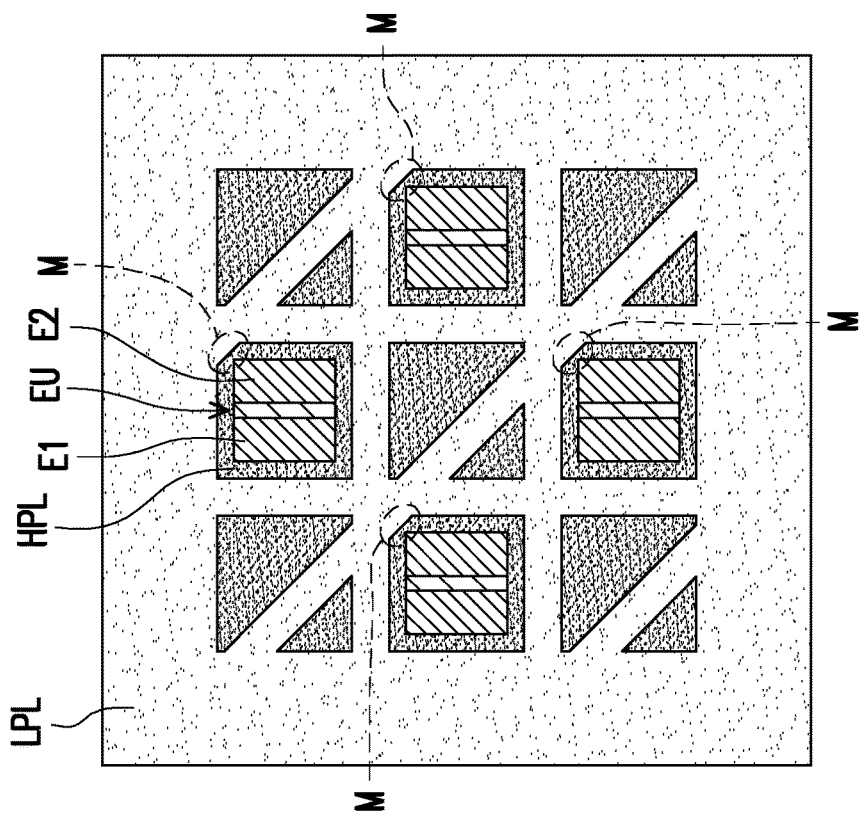

After the steps of FIG. 1 to FIG. 4, referring to FIG. 5 and FIG. 14, in the embodiment, a plurality of first grooves C1 is formed in the phosphor resin layer PL to separate the phosphor resin layer PL into a plurality of portions P (for example, nine portions P are formed, though the invention is not limited thereto). An extending direction of the first grooves C1 is substantially parallel to two opposite sides of each portion P of the phosphor resin layer PL.

Figure 15:
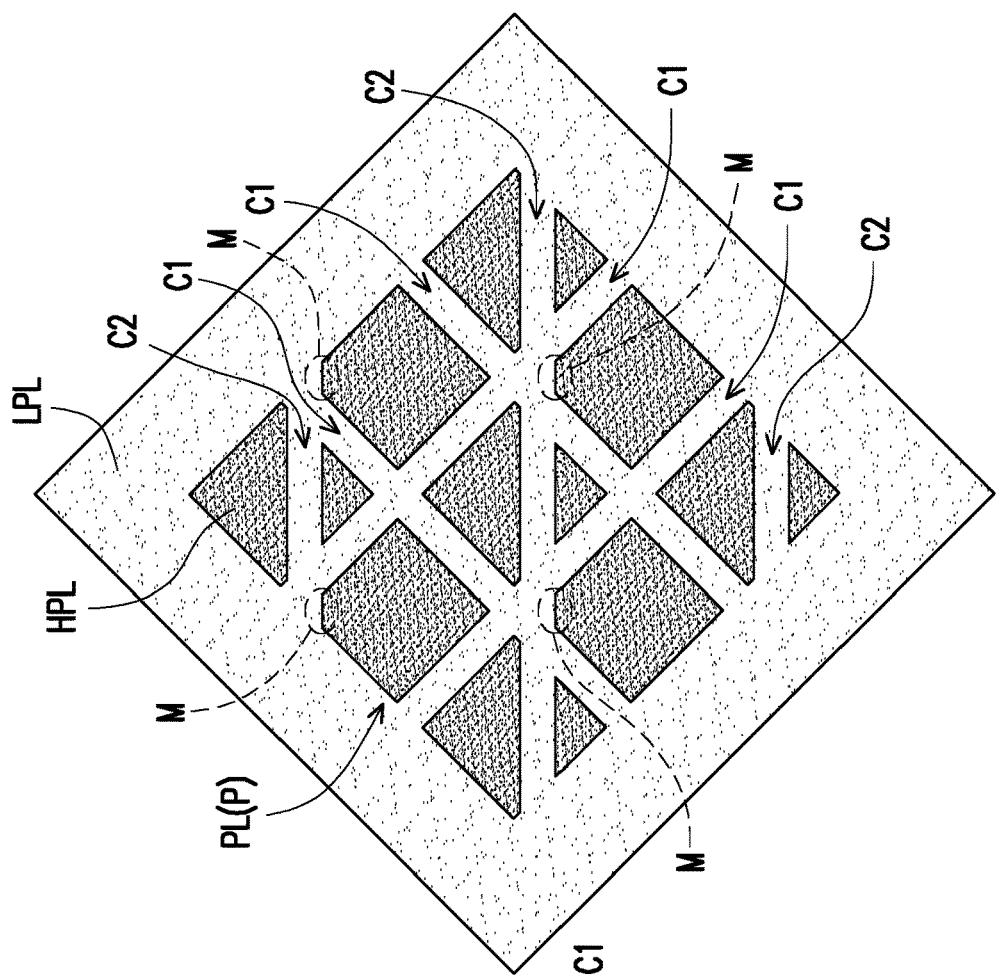
FIG. 14 to FIG. 19 are schematic diagrams of a manufacturing flow of a light emitting device according to a second embodiment of the invention.

Referring to FIG. 15, a plurality of marks M is respectively formed at one side of the portions P of the phosphor resin layer PL. In the embodiment, the method of forming the plurality of marks M is as follows: based on FIG. 14, a second cutting procedure is performed on the portions P of the phosphor resin layer PL, so as to respectively form a plurality of second grooves C2 in the portions P of the phosphor resin layer PL. In detail, in the embodiment, the second cutting procedure is substantially similar to the step of FIG. 6, and a main difference there between is that before the second cutting procedure is performed, the whole release film (not shown) is rotated by an angle, and then the second cutting procedure is performed. Therefore, a cutting direction of the second cutting procedure and the cutting direction of the first cutting procedure have an included angle there between, and the included angle is, for example, 45 degrees, though the invention is not limited thereto. According to FIG. 15, it is known that an extending direction of the first grooves C1 is different to an extending direction of the second grooves C2.

Figure 16:
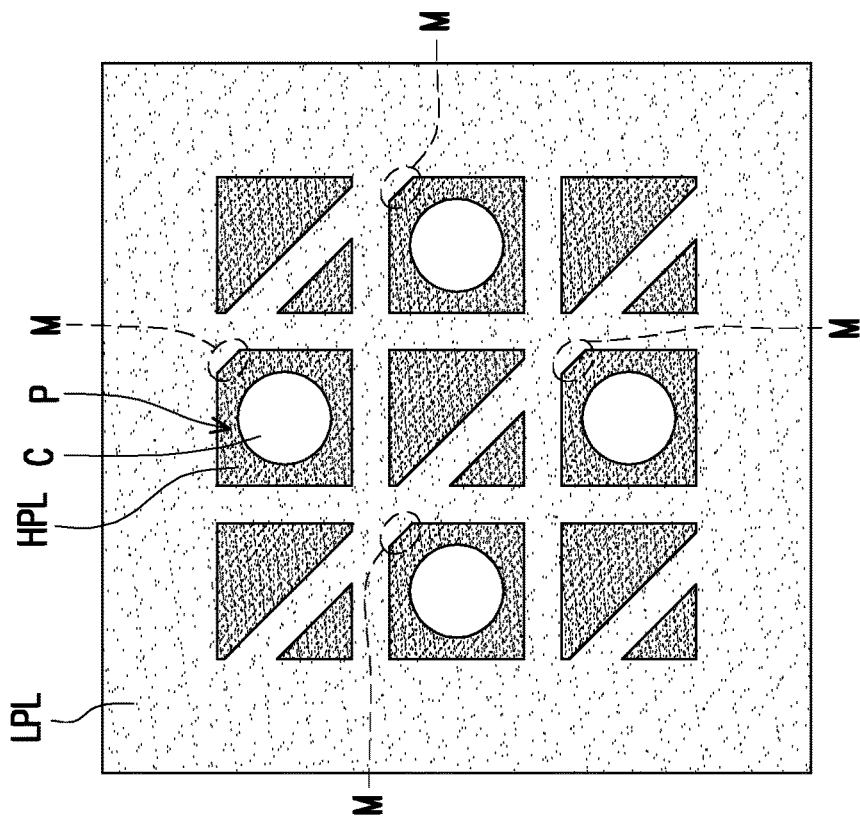

Referring to FIG. 16, a plurality of light transmissive resin layers C is respectively formed on the first portions HPL1 of the high-concentration phosphor resin layers HPL in the bonding areas BA. It should be noted that due to the second cutting procedure, the high-concentration phosphor resin layers HPL2 of some portions P are cut in the center, which are not suitable for the subsequent bonding procedure. Therefore, in FIG. 16, the light transmissive resin layers C are mainly formed on the portions P with chamfers (the marks M).

Figure 18:
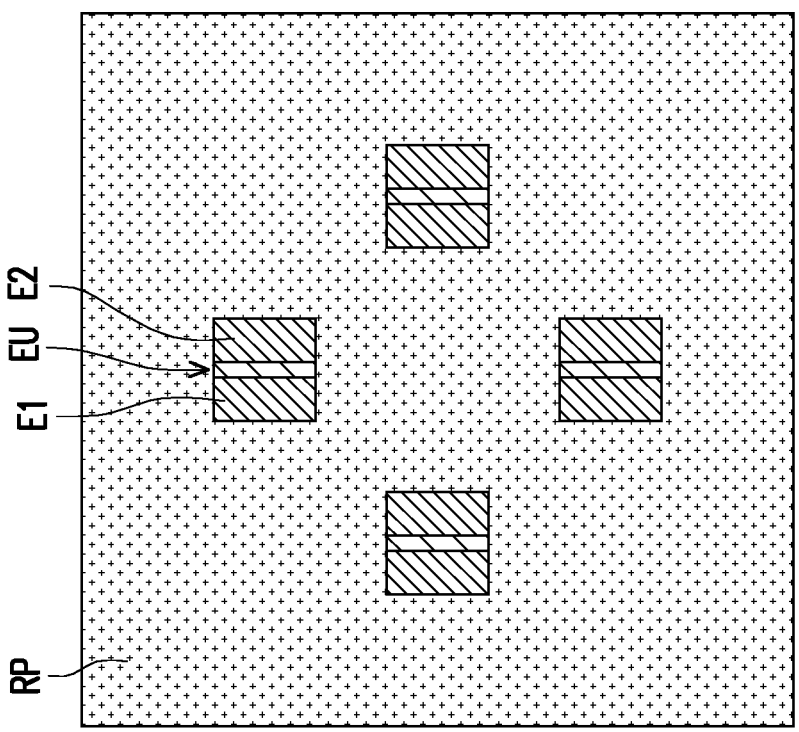

Referring to FIG. 18, the reflection protective member RP is formed on the phosphor resin layer PL and between the light emitting units EU and fills the first grooves C1 and the second grooves C2. The reflection protective member RP exposes the electrodes E1 and E2.

Figure 19:
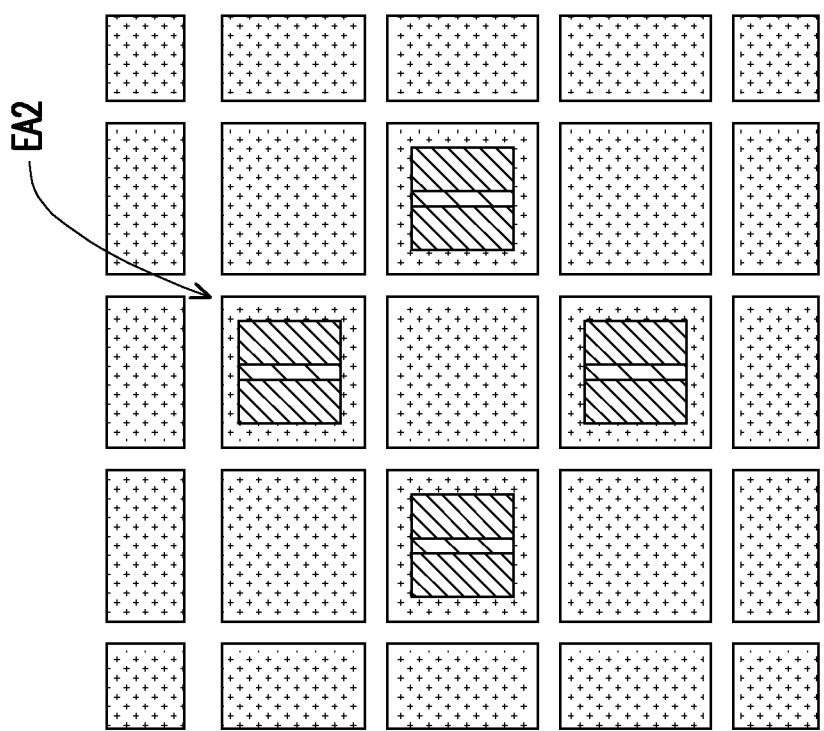
Figure 20:
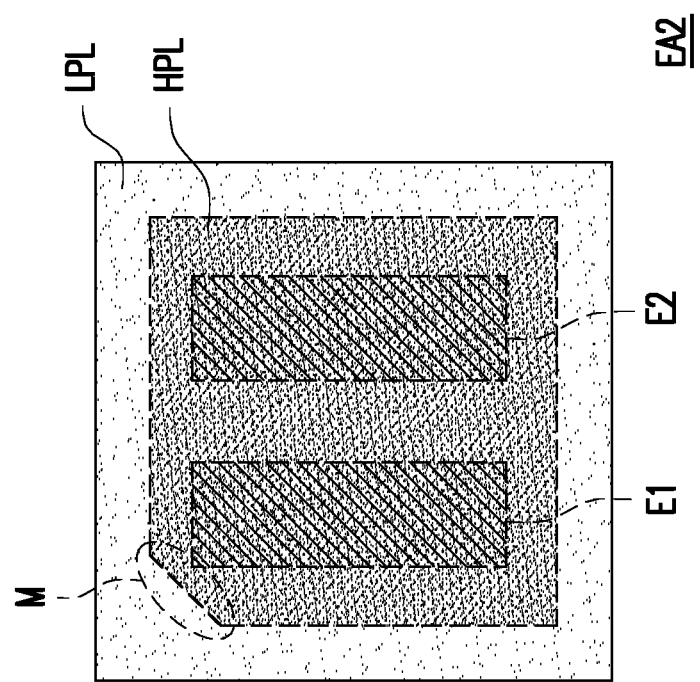
FIG. 20 is a top view of the light emitting device of the second embodiment.
Figure 23:
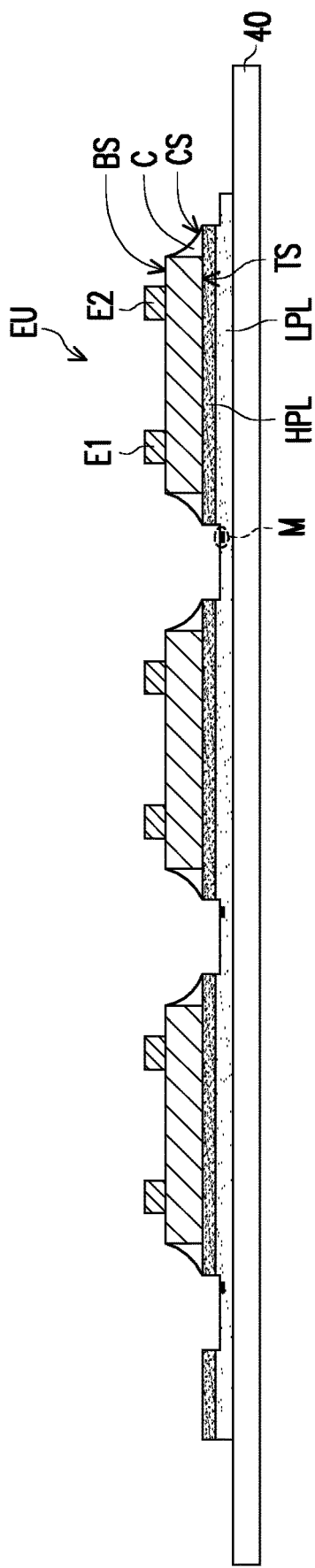
Figure 24:
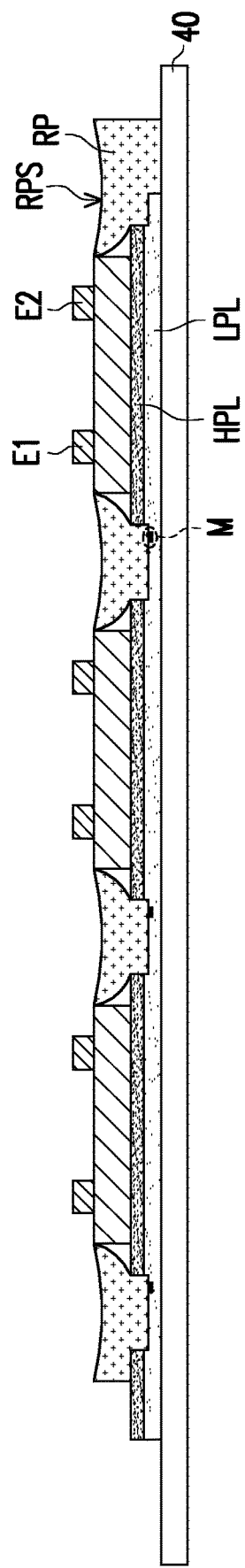

Referring to FIG. 19, a final cutting procedure is performed along the first grooves C1 to form a plurality of light emitting devices EA2. Till now, manufacturing of the light emitting devices EA2 is substantially completed.

Referring to FIG. 20, the light emitting device EA2 of the embodiment is substantially similar to the light emitting device EA of FIG. 12 and FIG. 13, and a main difference there between is that one side of the phosphor resin layer PL of the light emitting device EA2 is configured with the chamfer, and the chamfer serves as the mark M.

Figure 27:
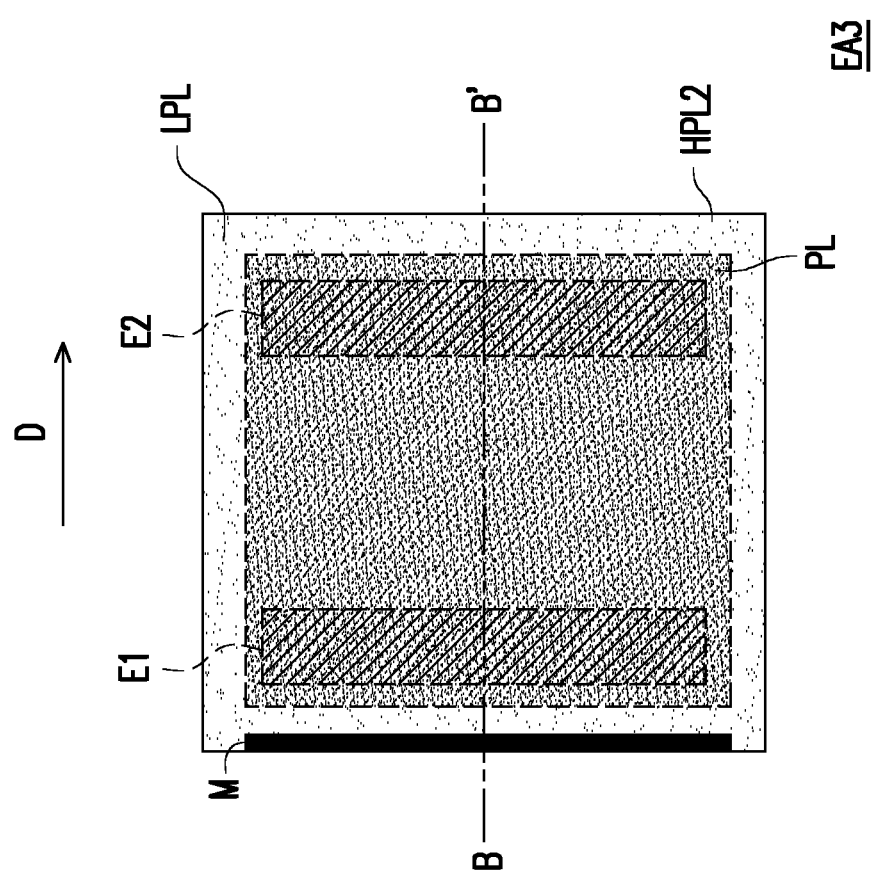
FIG. 27 is a top view of the light emitting device of the third embodiment.
Figure 28:
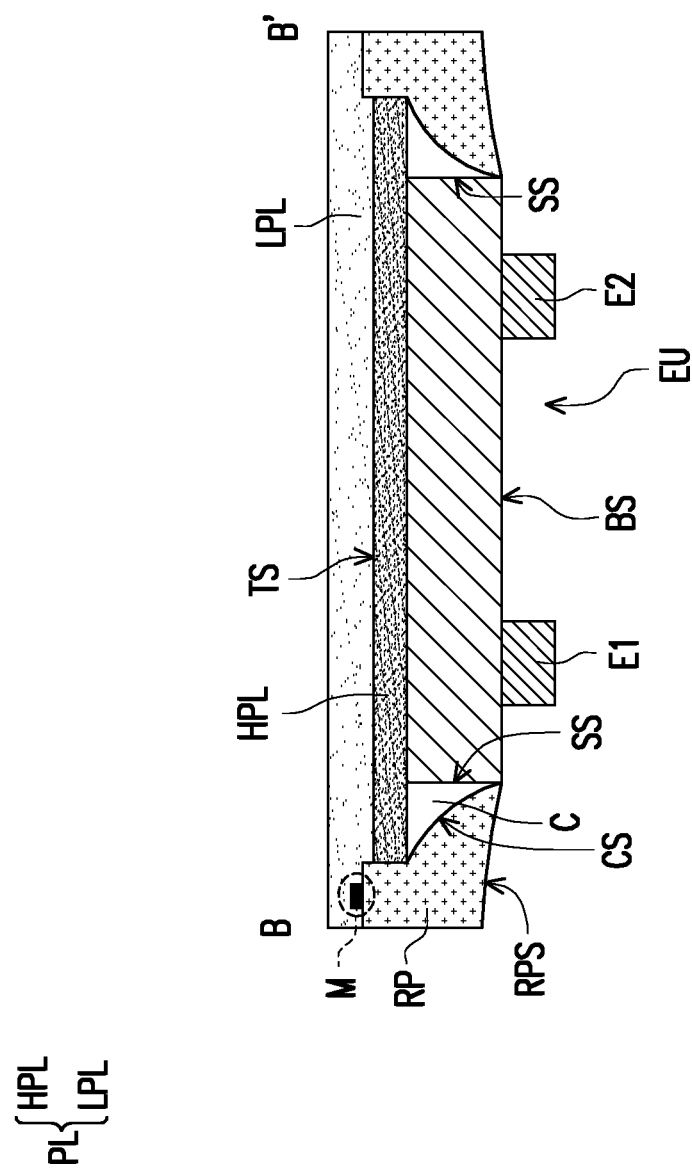
FIG. 28 is a cross-sectional view of FIG. 27 viewing along a section line B-B'.

FIG. 21 to FIG. 26 are schematic diagrams of a manufacturing flow of a light emitting device according to a third embodiment of the invention. FIG. 27 is a top view of the light emitting device of the third embodiment. FIG. 28 is a cross-sectional view of FIG. 27 viewing along a section line B-B'.

Some steps of the manufacturing flow of the light emitting device EA3 of the third embodiment are similar to that of the manufacturing flow of the light emitting device EA of the first embodiment, and only differences there between are described below.

After the steps of FIG. 1 to FIG. 5, referring to FIG. 21, laser light is adopted to irradiate the portions P of the phosphor resin layer PL, so that the low-concentration phosphor resin layer LPL in each of the portions P is blackened to form a laser notch on the low-concentration phosphor resin layer LPL, and the laser notch serves as the mark M. Moreover, in the embodiment, a pattern of the laser notch is strip-like, and in other embodiments, a round pattern, a square pattern or other shapes may also be adopted, which is not limited by the invention.

Then, steps of FIG. 22 to FIG. 26 are substantially similar to the steps of FIG. 7 to FIG. 11, and details thereof are not repeated.

Referring to FIG. 27 and FIG. 28, the light emitting device EA3 of the embodiment is substantially similar to the light emitting device EA of FIG. 12 and FIG. 13, and a main difference there between is that one side of the phosphor resin layer PL of the light emitting device EA3 is configured with the laser notch, and the laser notch serves as the mark M. Moreover, in the embodiment, the mark M is, for example, close to the electrode E1 serving as the N-type electrode, though the invention is not limited thereto.

It should be noted that in the embodiments of the invention, the pattern of the marks M is, for example, a notch, a chamfer, a gradation of color formed between the high-concentration and low-concentration phosphor resin layers, and in other embodiments, the pattern of the marks M may also be a round breach, a triangular breach or other polygon breach or other marks that may be obviously identified by naked eyes, which is not limited by the invention.

In summary, in the light emitting device and the manufacturing method thereof of the embodiments of the invention, since the marks spaced by different distances with the two electrodes are configured on the phosphor resin layer, the user may accordingly determine the polarities of the electrodes according to the relative positions of the marks and the two electrodes, so as to greatly reduce the chance of reversely connecting the electrodes.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A light emitting device, comprising:
   a light emitting unit, having a top surface and a bottom surface opposite to each other, and each of the light emitting units comprising two electrodes, wherein the two electrodes are disposed on the bottom surface; and
   a phosphor resin layer, disposed on the top surface of the light emitting unit, wherein a mark is formed on one side of the phosphor resin layer, wherein the phosphor resin layer comprises a low-concentration phosphor resin layer and a high-concentration phosphor resin layer stacked with each other, and the high-concentration phosphor resin layer is located between the light emitting unit and the low-concentration phosphor resin layer,
   wherein one of the two electrodes is closer to the mark with respect to the other one of the two electrodes.

2. The light emitting device as claimed in claim 1, wherein a groove is configured on the side of the phosphor resin layer, the groove penetrates through the high-concentration phosphor resin layer and exposes a part of the low-concentration phosphor resin layer, the groove separates the high-concentration phosphor resin layer into a first portion and a second portion with different sizes, wherein the mark at least includes a smaller one of the first portion and the second portion of the high-concentration phosphor resin layer.

3. The light emitting device as claimed in claim 1, wherein the side of the phosphor resin layer is configured with a chamfer, and the chamfer serves as the mark.

4. The light emitting device as claimed in claim 1, wherein the side of the phosphor resin layer is configured with a notch, and the notch serves as the mark.

5. The light emitting device as claimed in claim 1, further comprising a reflection protective member covering the light emitting unit and a part of the phosphor resin layer, and at least exposing the two electrodes and the low-concentration phosphor resin layer.

6. The light emitting device as claimed in claim 5, wherein the reflection protective member has a concave surface, and the concave surface is recessed toward the phosphor resin layer.

7. The light emitting device as claimed in claim 6, wherein a first side of the concave surface contacts the light emitting unit, and a second side of the concave surface faces the phosphor resin layer and extends toward a direction away from the light emitting unit.

8. The light emitting device as claimed in claim 1, further comprising a light transmissive resin layer, the light emitting unit further comprising a side surface connected to the top surface and the bottom surface, wherein the light transmissive resin layer is configured on the high-concentration phosphor resin layer and extends to the side surface of the light emitting unit.

* * * * *